United States Patent
Torrisi et al.

(10) Patent No.: US 9,992,916 B2
(45) Date of Patent: Jun. 5, 2018

(54) THERMAL CONTROL PROCESS FOR A MULTI-JUNCTION ELECTRONIC POWER DEVICE AND CORRESPONDING ELECTRONIC POWER DEVICE

(71) Applicants: STMICROELECTRONICS S.r.l., Agrate Brianza (IT); STMICROELECTRONICS APPLICATION GMBH, Ascheim-Dornach (DE)

(72) Inventors: Giovanni Luca Torrisi, Aci Catena / Catania (IT); Domenico Massimo Porto, Catania (IT); Sergio Lecce, Pavia (IT); Manuel Gaertner, Feldkirchen (DE)

(73) Assignees: STMICROELECTRONICS S.R.L., Agrate Brianza (MB) (IT); STMICROELECTRONICS APPLICATION GMBH, Ascheim-Dornbach (DE)

( * ) Notice: Subject to any disclaimer, the term of this patent is extended or adjusted under 35 U.S.C. 154(b) by 482 days.

(21) Appl. No.: 14/595,391

(22) Filed: Jan. 13, 2015

(65) Prior Publication Data
US 2015/0208557 A1    Jul. 23, 2015

(30) Foreign Application Priority Data

Jan. 21, 2014 (IT) .............. MI2014A0068

(51) Int. Cl.
*H01H 35/00* (2006.01)
*H01H 35/14* (2006.01)
(Continued)

(52) U.S. Cl.
CPC ........ *H05K 7/20945* (2013.01); *H01L 23/34* (2013.01); *H01L 2924/0002* (2013.01); *H03K 2017/0806* (2013.01); *Y10T 307/773* (2015.04)

(58) Field of Classification Search
CPC ..................... H05K 7/20945; H01L 23/34
(Continued)

(56) References Cited

U.S. PATENT DOCUMENTS

| 5,008,736 A | 4/1991 | Davies et al. |
| 2006/0075760 A1* | 4/2006 | Im ............ H01L 22/34 62/3.7 |

(Continued)

FOREIGN PATENT DOCUMENTS

EP    0 821 459    1/1998

*Primary Examiner* — Carlos Amaya
(74) *Attorney, Agent, or Firm* — Slater Matsil, LLP (57) ABSTRACT

A thermal control process for an electronic power device including a multi-junction integrated circuit may include defining a first and at least one second groups of junctions, with each group including one first and at least one second junctions, and associating a thermal detector with each group. A first group control may be executed which detects group electric signals representative of the temperature detected by the thermal detectors, processes the group electric signals with reference to a group critical thermal event, identifies a critical group when the corresponding group electric signal detects the critical group thermal event, and generates group deactivating signals suitable for selectively deactivating the first and the at least one second junctions of the identified critical group with respect to the remaining junctions of the integrated circuit.

17 Claims, 7 Drawing Sheets

(51) Int. Cl.

| | |
|---|---|
| *H01H 37/00* | (2006.01) |
| *H01H 47/24* | (2006.01) |
| *H01H 47/26* | (2006.01) |
| *H05K 7/20* | (2006.01) |
| *H01L 23/34* | (2006.01) |
| *H03K 17/08* | (2006.01) |

(58) Field of Classification Search
USPC .......................................................... 307/117
See application file for complete search history.

(56) References Cited

U.S. PATENT DOCUMENTS

2006/0221527 A1  10/2006  Jacobson
2008/0285623 A1*  11/2008  Petruzzi .................. H01L 23/34
                                                    374/163

\* cited by examiner

THERMAL CONTROL PROCESS FOR A MULTI-JUNCTION ELECTRONIC POWER DEVICE AND CORRESPONDING ELECTRONIC POWER DEVICE

TECHNICAL FIELD

The present disclosure generally refers to a process for thermally controlling an electronic power device having multiple junctions. Further, the present disclosure refers to an electronic power device having multiple junctions.

BACKGROUND

In an electronic power device, heating is an important consideration in relation to high power application over an extended period of time. The greater the operative energy, i.e., the product between the voltage across the device and the current flowing in it, the more energy the device will use for dissipating the generated heat to prevent its failure due to overheating.

The temperature reached by the device is usually identified as the junction temperature. For example, the critical junction temperature typically be greater than Timax.

Control circuits are used for thermal protection. They enable automatically turning off the power device when a critical temperature is reached, or when a current limit is detected.

Some control circuits require the integration of temperature sensors "on-chip" in the silicon die. If a threshold temperature is detected by one of the sensors, the device shuts down automatically, and the power device is kept turned off until the temperature detected by the sensors returns below a safety level by dissipating the heat through the package.

Figures 1, 2:
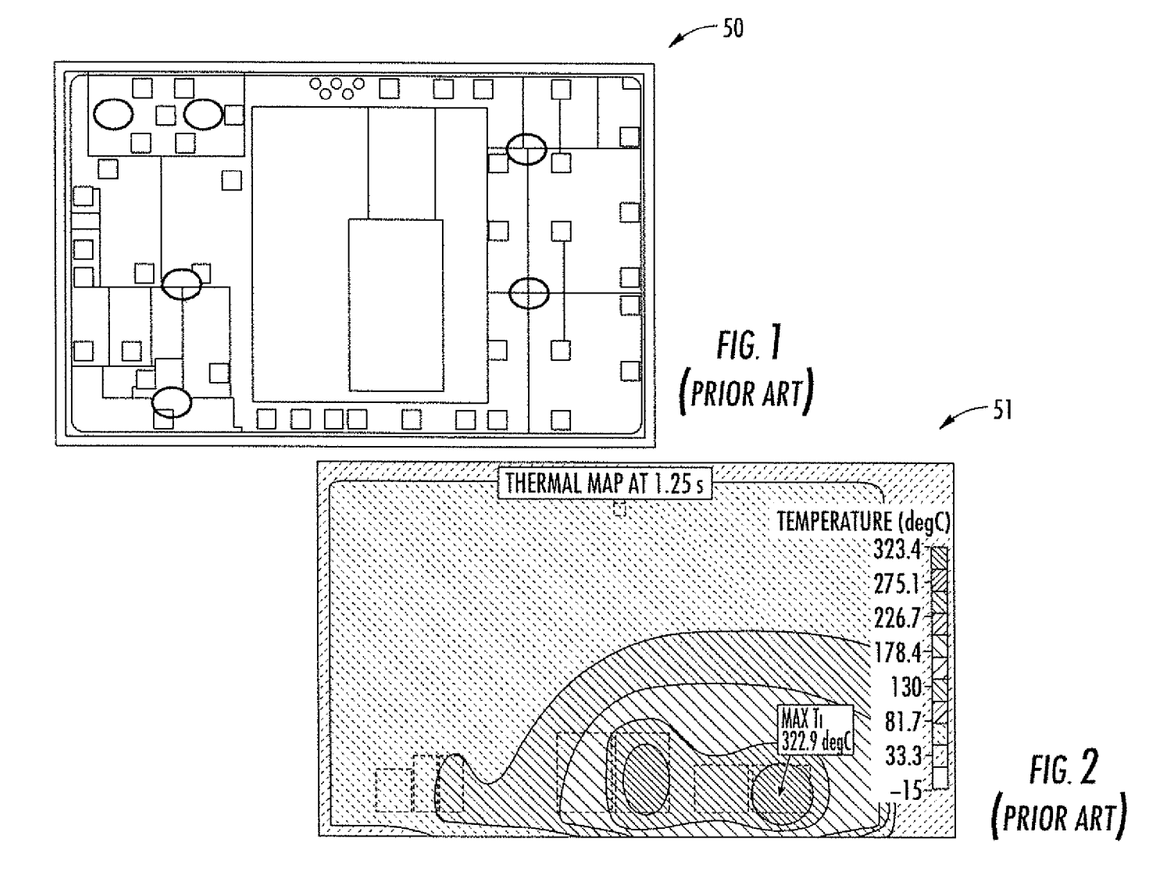
FIG. 1 is a plan view of a power device in which the temperature sensors, implemented according to the prior art, have been highlighted with ovals.
FIG. 2 is a thermal map of the power device in FIG. 1, obtained by a test performed by the present Applicant.

As schematically shown in FIG. 1, the sensors are arranged at the hottest points of the semiconductor die 50, and the detected temperatures are processed in parallel by the control circuits by an OR operator. The positions of the hottest points may already be known, for example, by a thermal map 51, as schematically shown in FIG. 2. FIG. 2 shows a test which the present Applicant executed on a power device by applying a load profile in a defined time range of 0.5 seconds repeated for 40 times.

Figures 3, 4, 5:
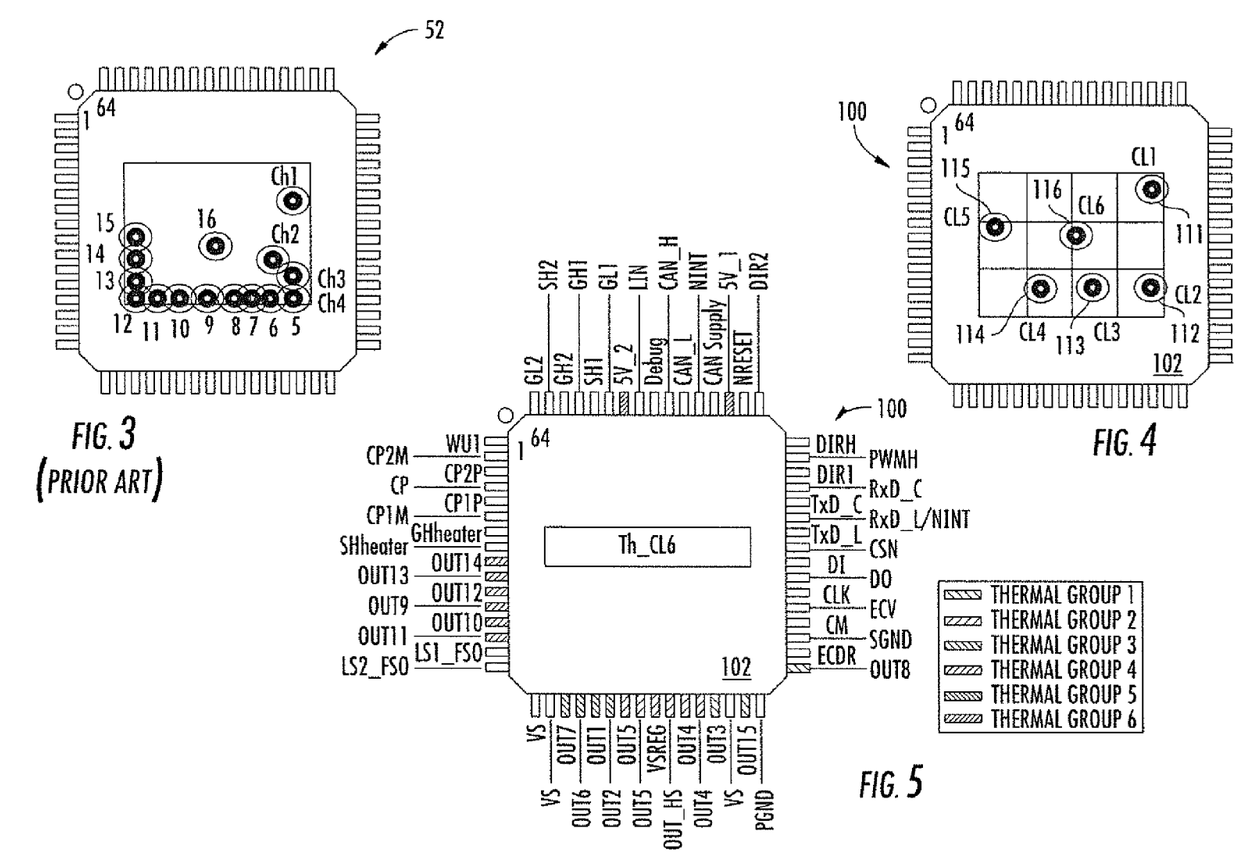
FIG. 3 is a schematic plan view of a power device with associated temperature sensors according to the prior art.
FIG. 4 is a schematic plan view of a power device according to an example embodiment.
FIG. 5 is a schematic plan view showing a practical example for grouping the power outputs of the device in FIG. 4.

FIG. 3 schematically shows a further possible arrangement of a power device 52 provided with sixteen channels and a corresponding number of sensors positioned at the single channels.

Prior approaches, even though they are suitable in some circumstances, may present some drawbacks. Indeed, during the power device operation, due to the high operative current density, reciprocal thermal impedances may be generated between adjacent channels. The temperatures detected by the sensors may be greater than the real temperatures, so that the power device may be turned off before reaching the temperature critical limits. This drawback may be substantially more acute in power devices with vertical dissipation.

Different causes inducing a turning off of the power device may include: the high dissipation of the electric power due to an overload caused by a short circuit, a wrong load control path, or the presence of inefficient solder connections; ambient temperature of the electric board that is too high due to the operation of other adjacent electronic devices; and the occurrence of an unexpected event.

An approach for avoiding such drawbacks is described in U.S. Pat. No. 5,008,736 to Davies et al., granted on 16, Apr. 1991, in which two overlapped chips, a first chip with the power transistor and second chip with the protection circuitry, are connected to obtain thermal protection. Such an approach, even though it may be suitable under certain circumstances, may not necessarily be generally extendable to other implementations.

Moreover, it may be desirable to avoid a complete turnoff of the power device if the critical events affect only a portion of the device.

It may also be desirable to detect currents just under the threshold which are damaging if they are endured for too much time.

It may further be desirable to define a thermal control process which may be effective also for devices operating with a very high current density, and with a number of junctions or channels in a range from 7 to 16, for example.

Further, it may be desirable to have a process which may be used with power devices operating with a junction critical temperature greater than about 175° C.

SUMMARY

According to a first aspect, a thermal control process for a power electronic device, for selectively deactivating at least one junction associated to a critical thermal event to help ensure a safe partial operation of the device is provided. This process may help overcome the above-mentioned drawbacks. A related electronic power device is also provided.

BRIEF DESCRIPTION OF THE DRAWINGS

Further characteristics and advantages of the process and of the device will be better understood from the following description, provided by way of example embodiments with reference to the attached drawings, in which.

DETAILED DESCRIPTION

An electronic power device 100 including an integrated circuit 102 is schematically shown in FIG. 4. Integrated circuit 102 is provided with at least one semiconductor substrate of the multi-junction or multi-channel-type.

The process for thermally controlling the power device 100 may involve defining, in the integrated circuit 102, a plurality of groups CL1-CL6 of junctions, where each group CL1-CL6 includes a first and at least one second junction. Further, the process may also involve associating respective thermal detectors 111-116 to each group CL1-CL6 of junctions which has been defined.

In the illustrated example, there are six junction groups CL1-CL6, each of which may have a variable number of junctions, e.g., from two to about six. The junction of each group CL1-CL6 may be identified according to specific and predetermined parameters, e.g., with reference to the spatial arrangement in the integrated circuit 102 or referring to their operation or according to other parameters.

The process may include identifying at least one critical group $CL'_x$ subjected to a critical thermal event by a first group control. More specifically, the first control may perform the following operations: receiving, from each thermal detector 111-116, group electric signals $V_{CL1}$-$V_{CL6}$ representative of the detected temperature; processing the group electric signals $V_{CL1}$-$V_{CL6}$ with reference to a group critical thermal event TTSD; identifying at least one critical group $CL'_x$ when the corresponding group electric signal $V_{CL1}$-$V_{CL6}$ detects the group critical thermal event TTSD; and generating group deactivating signals $OUT_{CL1}$-$OUT_{CL6}$ suitable for selectively deactivating the junctions of the identified critical group $CL'_x$ by simultaneously maintaining active the remaining junctions of the integrated circuit 2.

The process may further provide a second junction control allowing for separate analysis of the junctions of the identified critical group $CL'_x$. The second control may perform the following operations: selectively activating one among the junctions of the critical group $CL'_x$ by generating an active junction; detecting the group electric signal $V_{CL'x}$ generated by the thermal detector 111-116 coupled to the critical group $CL'_x$; processing the group electric signal $V_{CL'x}$ with reference to a junction critical thermal event $T_{out}$; and generating a junction deactivating signal $OUT_{CL'x}$ suitable for selectively deactivating the active junction of the critical group $CL'_x$ when the group electric signal $V_{CL'x}$ detects the junction critical thermal event $T_{out}$. The second control may be repeated by activating separately and selectively the junctions of the critical group $CL'_x$.

It should be noted that the group critical thermal event TTSD may be identified by a first group temperature critical value, or by a predefined variation of the group electric signal $V_{CL1}$-$V_{CL6}$. This allows for location of groups CL1-CL6 subjected to unjustified variations of temperature.

Analogously, the junction critical thermal event $T_{out}$ may be identified by a junction temperature threshold, or by a predefined variation of the detected group critical electric signal $V_{CL'x}$, enabling location of junctions subjected to unjustified variations of temperature.

According to an example embodiment, the process may include digitizing the group electric signals $V_{CL1}$-$V_{CL6}$ supplied by each thermal detector 111-116 by a converter block 120, and processing the digitized group signals $DV_{CL1}$-$DV_{CL6}$ by a control logic module 130.

Converter block 120 may be implemented by an analog-digital A/D converter 121. According to an example embodiment, the A/D converter 121 may be of the 10 bit-type. This is a very efficient converter which may allow for detection of a variation of the group electric signal $V_{CL1}$-$V_{CL6}$ corresponding to a temperature variation of 0.2° C.

The control logic module 130 may be implemented by providing a logic controller 131, first storing means or device 132, second storing means or device 133, and an additional logic unit 135. These components may communicate with each other by suitable terminals or buses and a communication interface.

The process may include supplying the digitized group signals $DV_{CL1}$-$DV_{CL6}$ to the logic controller 131 and the first storing device 132 respectively by output terminals or buses 126, 136. Further, the process may include implementing the first storing device 132 by a group of first state registers T1-T6 by arranging, according to an embodiment, a state register for each logic detector 111-116, which are suitable for storing diagnostic information.

During the first control, the digitized group signals $DV_{CL1}$-$DV_{CL6}$ may be compared with first group temperature critical value TTSD. This identifies the group critical thermal event. By such comparison, the logic controller 131 generates, for each group CL1-CL6, corresponding group monitoring signals $TSD_{CL1-CL6}$.

Group monitoring signals $TSD_{CL1-CL6}$ may be supplied to an additional logic 135 by a further transfer bus 139, may be are stored in the state registers of the second storing device 133. Group monitoring signals $TSD_{CL1-CL6}$, according to an example embodiment schematically shown in FIG. 14, may be stored in suitable memories SR6 (0, . . . 5).

Additional logic 135 analyzes the group monitoring signals $TSD_{CL1-CL6}$, and identifies a critical group $CL'_x$ when the corresponding group monitoring signal $TSD_{CL1-CL6}$ exceeds the first critical value TTSD. Therefore, additional logic 135 generates, at corresponding output terminals 141x-146x, group deactivating signals $OUT_{CL1}$-$OUT_{CL1}$ for deactivating all the junctions of the identified critical group $CL'_x$.

The first group control may also provide further intermediate controls, wherein digitized group signals $DV_{CL1}$-$DV_{CL6}$ are compared with at least a second group temperature value TTW for generating further monitoring signals $TSD_{CL1-CL6}$. These are analyzed to detect possible sub-threshold values. According to an example embodiment, the at least one second temperature group value TTW may be less than the first temperature group value TTSD. Such temperature values may be also selectively diversified for each group CL1-CL6.

It is useful to note that the second control may be performed during the operation of the remaining junctions of integrated circuit 102. This keeps the power device 100 partially operational.

Specifically, the second junction control may provide for separate activation of each junction belonging to a critical group $CL'_x$, by the additional logic unit 135. Particularly, the activation may be done selectively and at designated times. The logic controller 131 detects the digitized group signals $DV_{CL'x}$ generated by thermal detector 111-116 coupled to the critical group $CL'_x$, and compares and processes the detected signals for generating by the additional logic unit 135 the junction deactivating signal $OUT_{CL'x}$. Particularly, deactivating signal $OUT_{CL'x}$ is generated when the processing detects a temperature increase in the selected junction during the time period in which the junction of critical group $CL'_x$ is maintained active, as schematically shown in the block diagrams of FIG. 11.

The period in which each single junction is activated is defined during the design step. This may depend on the type of the associated channels and loads. Subsequently, a junction is deactivated only when the active junction verifies the junction critical thermal event $T_{out}$ by the deactivating signal $OUT_{CL'x}$, which is therefore selective. The remaining junctions of the critical group $CL'_x$ remain active or are reactivated if they are not subjected to corresponding critical events.

According to an example embodiment, all the junctions of the critical group $CL'_x$ are deactivated when the second junction control does not identify at least one junction subjected to the junction critical thermal event $T_{out}$.

Figures 12, 13:
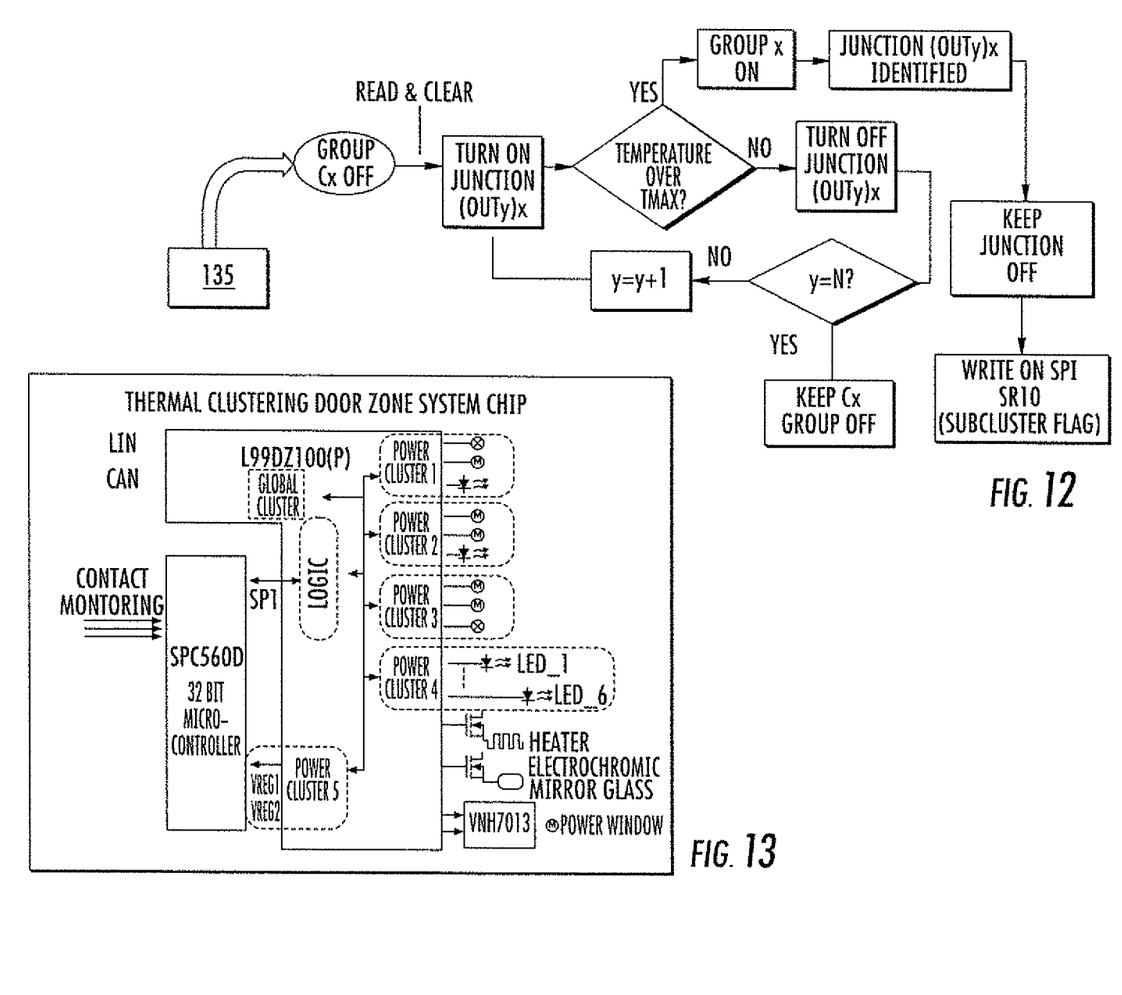
FIGS. 13-15 are schematic diagrams illustrating various aspects of an electronic power device according to an example embodiment.

In the example schematically illustrated in FIG. 12, the junction critical thermal event $T_{out}$ may be determined by comparing the digitized group signals $DV_{CLx}$ with a maximum junction temperature value Tmax. The deactivating selective signal $OUT_{CL'x}$ is therefore generated when such value is exceeded.

Figure 6:
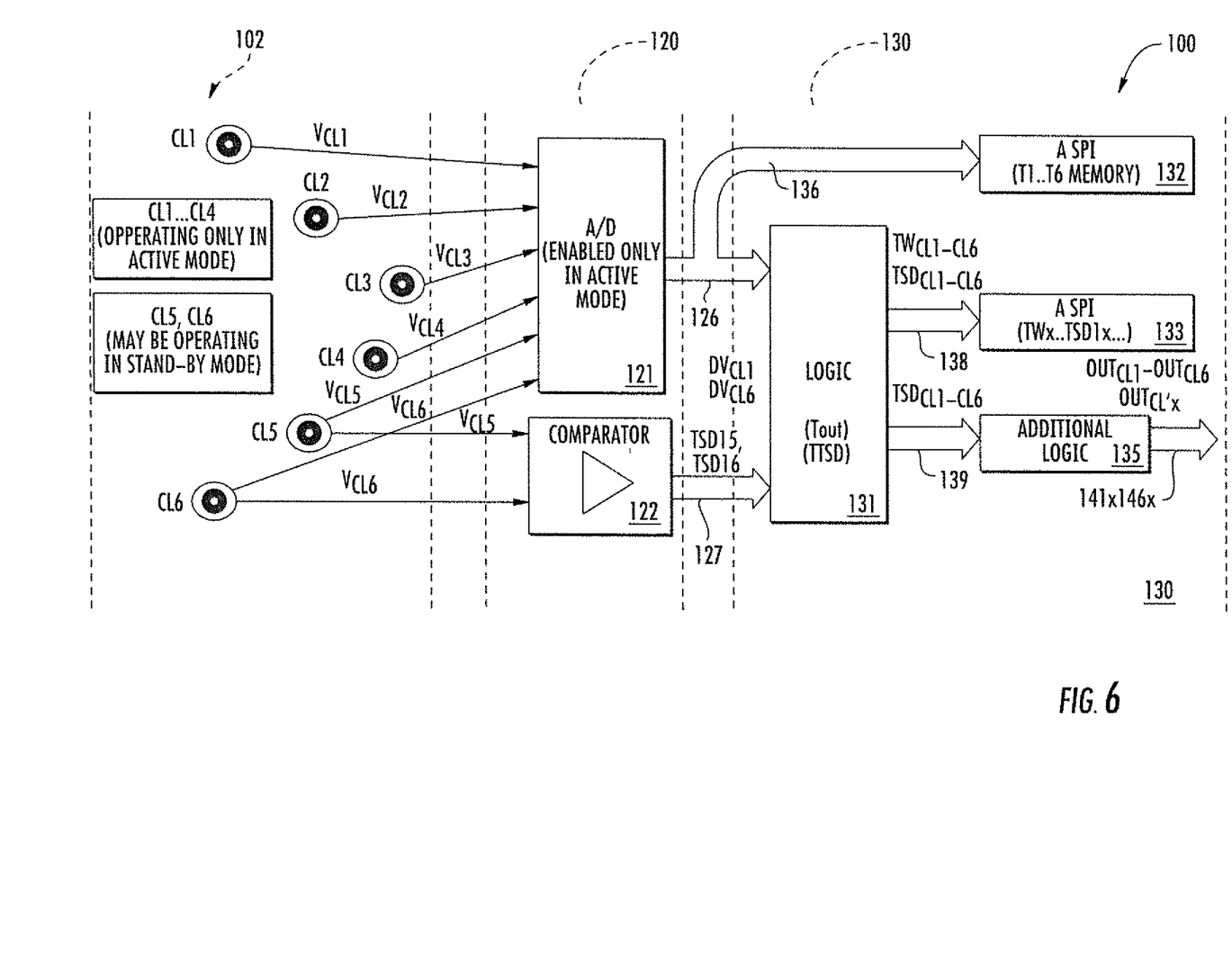
FIG. 6 is a schematic block diagram of a power device according to an example embodiment.
Figures 8, 9:
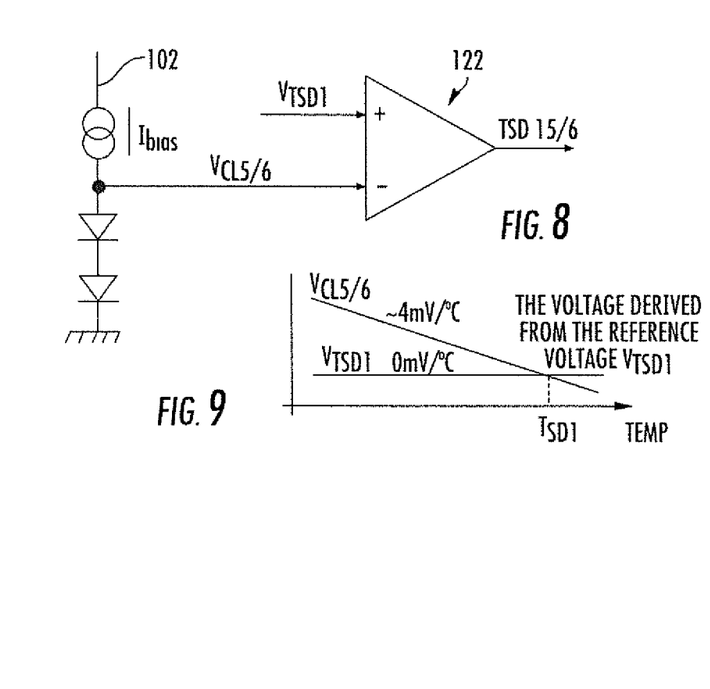
FIGS. 8 and 9 are schematic diagrams respectively showing a optional detail of the device of FIG. 6, and an example of the present waveforms.

According to an example embodiment, converter block 120 also provides a level comparator 122. Level comparator 122 is configured to receive group electric signals $V_{CL5}$-$V_{CL6}$ associated to predefined groups CL5-CL6, presenting at least one operative junction at a low current I. Level comparator 122 generates digitized signals $TSD_{15}$ and $TSD_{16}$ which are supplied to logic controller 131 by output terminals or buses 127, as schematically shown in FIGS. 6, 8 and 9.

It should be noted that groups CL1-CL6 associated with the level comparator 122 are changeable in number for different design configurations.

It is also worth noting that the level comparator 122 may require power during the operation which is less than the power required by comparator A/D 121. Thus, it may be activated when power device 100 is in a stand-by state or non-operational for reducing the required operating power.

According to an example embodiment, the first group control may provide for analyzing, and according to a predetermined order, each group CL1-CL6 of integrated circuit 102. The second junction control may allow for analyzing the junctions of critical group $CL'_x$, by sequentially activating each junction for a predetermined time interval.

Figure 7:
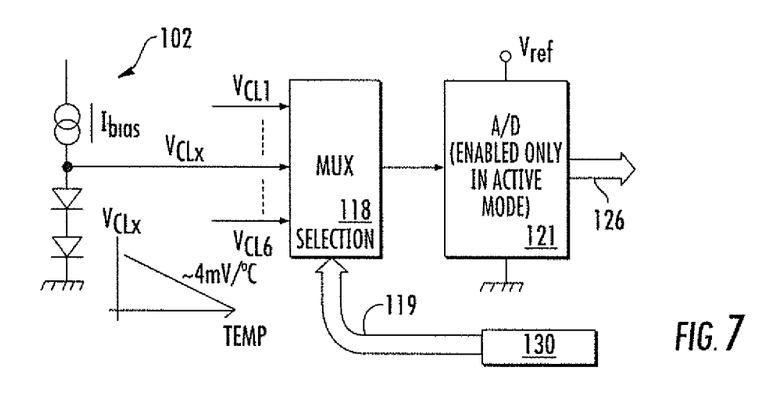
FIG. 7 is a schematic diagram showing further details of the device of FIG. 6 in an example embodiment.

In the example shown in FIG. 7, a multiplexer 118 is interposed between integrated circuit 102 and A/D converter 121, and control of the multiplexer 118 is accomplished by a selection signal 119 generated by control logic module 130. This enables detection of the group electric signals $V_{CL1}$-$V_{CL6}$ according to a predefined and modifiable sequence.

The present disclosure also provides a multi-junction electronic power device 100 suitable for being temperature-controlled by a control process, as described above. In the following description parts and details already described above and having the same structure and function will be identified by the same signs and reference numbers.

The device 100 illustratively includes an integrated circuit 102 including at least one multi-junction or multi-channel-type semiconductor substrate. Integrated circuit 102 illustratively includes a plurality of groups CL1-CL6 of junctions, where each group CL1-CL6 includes a first and at least one second junction. The junctions of integrated circuit 102 may be subdivided based on the spatial position or their function or reference magnitude.

Figure 14:
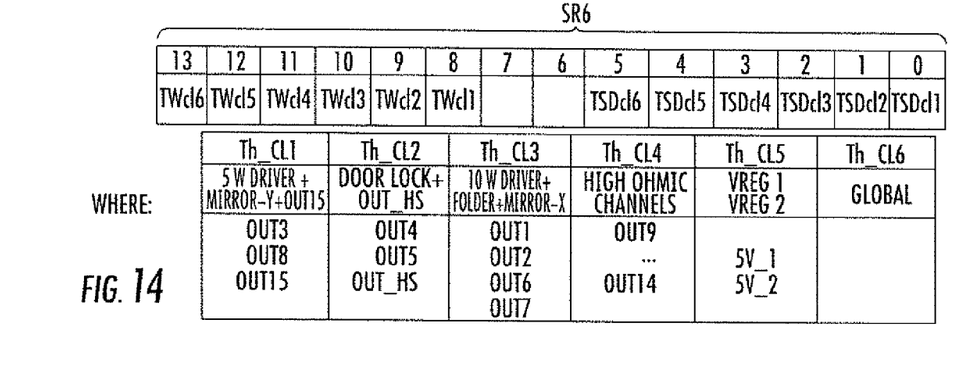

According to the embodiment illustrated in FIGS. 5 and 14, junctions of the integrated circuit 102 are subdivided in six groups CL1-CL6, and the first group CL1 includes three junctions identified as $OUT_3$, $OUT_8$ and $OUT_{15}$, the second group CL2 includes three junctions $OUT_4$, $OUT_5$ and $OUT_{15}$, etc.

Each group CL1-CL6 includes a thermal detector 111-116 coupled to the semiconductor substrate and associated with the junctions of the corresponding group CL1-CL6. Each thermal detector 111-116 is configured to generate corresponding group electric signals $V_{CL1}$-$V_{CL6}$ representative of the detected temperature.

The device 100 illustratively includes a control logic module 130 which is provided with a logic controller 131 coupled to the first storing device 132 and the second storing device 133 by a transfer bus 138 via a communication protocol.

The control module 130 also illustratively includes an additional logic unit 135 coupled to the logic controller 131 by a further transfer bus 139. Output terminals 141x-146x are to be coupled to the junctions of groups CL1-CL6.

First and second storing devices 132, 133 include first and second state registers T1-T6 and T1'-T6', respectively, one state register for each logic detector 111-116 and therefore for each group CL1-CL6. Control logic module 130 is configured to receive and process the group electric signals $V_{CL1}$-$V_{CL6}$ and to detect a critical group $CL'_x$ when the corresponding group electric signal $V_{CLx}$ detects a group critical thermal event TTSD.

Further, control logic module 130 is configured to execute a first control of the groups CL1-CL6 by generating group deactivating signals $OUT_{CL1}$-$OUT_{CL6}$, which through the output terminals 141x-146x are adapted to selectively deactivate the junctions of critical group $CL'_x$, with reference to the remaining junctions of the integrated circuit 102.

The control logic module 130 is also configured to execute a second junction control adapted to selectively activate the junctions of the detected critical group $CL'_x$, and generate a selective junction deactivating signal $OUT_{CL'x}$ suitable for deactivating the junction activated when group electric signal $V_{CL'x}$ detects a junction critical thermal event $T_{out}$.

According to the embodiment illustrated in FIG. 6, the device 100 further includes a converter block 120 provided with an analog-digital A/D converter 121. Converter block 120 may receive the group electric signals $V_{CL1}$-$V_{CL6}$ and for generating corresponding digitized group signals $DV_{CL1}$-$DV_{CL6}$, which, by output terminals or buses 126, are supplied to control logic module 130. According to an example embodiment, A/D converter 121 is of the 10 bit-type and may detect a variation of the digitized group signal DVCL1-DVCL6 corresponding to a temperature variation of 0.2° C.

First storing device 132 receives the digitized group signals $DV_{CL1}$-$DV_{CL6}$ by an output bus 136 coupled to the output bus 126 interposed between converter block 120 and control logic module 130. Logic controller 131 and additional logic unit 135 are configured to perform the first control of the group monitoring signals $TSD_{CL1-CL6}$.

More specifically, logic controller 131 is configured to compare the digitized group signals $DV_{CL1}$-$DV_{CL6}$ with a first group critical temperature value TTSD identifying a group critical thermal event to generate for each group CL1-CL6 corresponding monitoring group signals $TSD_{CL1-CL6}$. Thus, logic controller 131 is configured to store in the second storing device 133 the monitoring group signals $TSD_{CL1-CL6}$, and to transfer them via the transfer bus 139 to an additional logic unit 135.

Additional logic unit 135 is configured to process the monitoring signals $TSD_{CL1-CL6}$ by identifying a critical group $CL'_x$ when the corresponding monitoring group signal $TSD_{CL1-CL6}$ exceeds the first group temperature value TTSD. Further, the additional logic unit 135 is configured to generate the group deactivating signals $OUT_{CL1}$-$OUT_{CL6}$, to selectively deactivate the junctions of the identified critical group $CL'_x$, and to keep active the remaining junctions.

Logic controller 131 and additional logic unit 135 are also configured to execute the second control of the junctions of the identified critical group $CL'_x$. The second control of the junctions of critical group CL'$_x$ is performed by keeping active the remaining junctions, and therefore the electronic power device 100 is partially operative. Therefore, the additional logic unit 135 is configured to selectively activate the junctions of the critical group CL'$_x$ by defining, from time to time, an active junction.

Accordingly, logic controller 131 is configured to process the digitized group signals DV$_{CL'x}$ supplied from thermal detector 111-116 coupled to the critical group CL'$_x$, and detect the possible critical thermal event T$_{out}$ of the active junction. Additional logic unit 135 is configured to generate the deactivating signal OUT$_{CL'x}$ of the active junction upon the detection of the junction critical thermal event T$_{out}$.

Figures 10, 11:
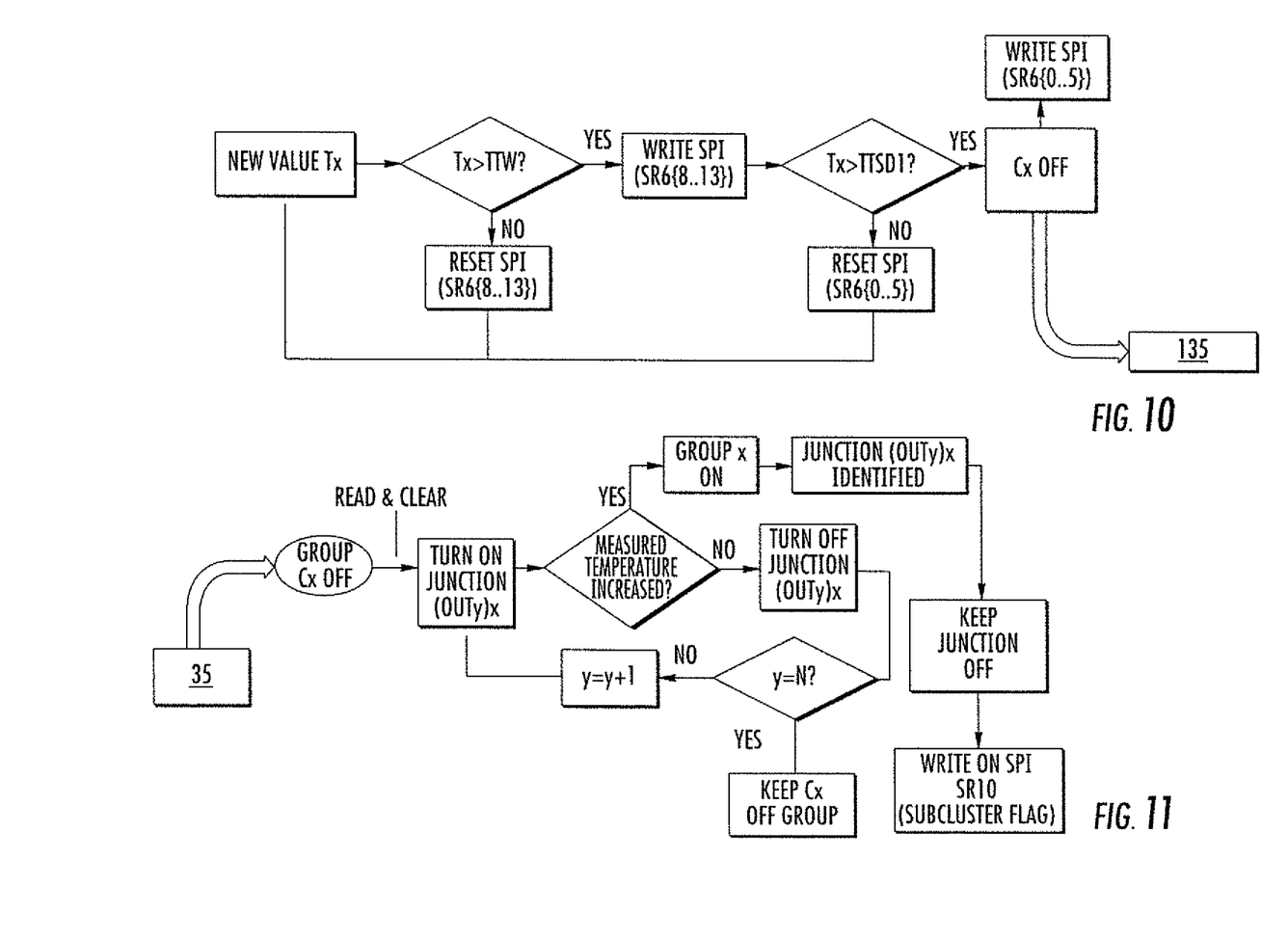
FIGS. 10-12 are flow diagrams illustrating method aspects associated with an electronic power device according to an example embodiment.

The junction critical thermal event T$_{out}$ may be a predefined variation of the digitized group signals DV$_{CL'x}$ for evaluating a critical junction temperature increase, as schematically illustrated in FIG. 11, or it may be a maximum junction temperature value Tmax reached by the digitized group signal DV$_{CL'x}$, as schematically illustrated in FIG. 12.

According to an example embodiment, logic controller 131 and additional logic unit 135 may be configured to provide further intermediate controls wherein the digitized group signals DV$_{CL1}$-DV$_{CL6}$ are compared with at least a second group temperature value TTW for generating further monitoring signals TSD$_{CL1-CL6}$, which are analyzed to detect possible sub-threshold values.

According to an example embodiment, at least one second group temperature value TTW is less than the first group temperature value TTSD. Such temperature values may also be selectively diversified for each group CL1-CL6.

Converter block 120 may also include a level comparator 122 configured to receive and digitize some predefined group electric signals V$_{CL1}$-V$_{CL6}$. Particularly, level comparator 122 may be associated with thermal detectors 115-116 of groups CL5-CL6 having at least one junction operating at a low current I. Level comparator 122 is adapted to be activated when power device 100 is in stand-by.

In the example illustrated in FIGS. 6, 8 and 9, the predefined group electric signals V$_{CL1}$-V$_{CL6}$ are referred to groups CL5 and CL6. In the example illustrated in FIG. 8, level comparator 122 detects a voltage V$_{CL5/6}$ of a junction of group CL5 or CL6, which is schematically represented by a current generator Ibias associated to a pair of biased diodes and connected to a ground reference. Level comparator 122 is configured to compare the group electric signals V$_{CL5}$ and V$_{CL6}$, i.e., the voltages of junctions V$_{CL5/5}$, as a function of temperature T, with a reference V$_{TSD1}$ to generate the corresponding digitized group signal TSD$_{15-16}$. Thus, the electronic comparator 122 is coupled to the logic controller 131 by a further output bus 127 adapted to transfer the digitized group electric signals TSD$_{15-16}$.

According to an example embodiment, the device 100 may further include a multiplexer 118 interposed between the integrated circuit 102 and A/D converter 121. Multiplexer 118 is configured to be controlled by a selection signal 119 generated by the control logic module 130 to detect the group electric signals V$_{CL1}$-V$_{CL6}$, according to a predefined and modifiable sequence.

The electronic power devices set forth herein may have a number of junctions or channels of about 15-16 or more, for example, which may represent more than double the number of junctions or channels present in some electronic power devices.

The proposed technique may help overcome the disadvantages of the prior configurations and particularly to detect, thanks to the first group control, the area in the power device which is critically heated and selectively deactivate only the junctions of the group subjected to the critical thermal event. In the meantime, the remaining junctions of the integrated circuit may be kept active by enabling a partial operation of the power device. Moreover, thanks to the second junction control, the junctions of the critical group which are effectively subjected to the critical thermal event may be identified and selectively deactivated.

The process may also simply and effectively generate further control strategies for predefined groups of junctions. Since the detected temperature signals are digitized and stored, it may be possible to perform specific controls to prevent possible sub-threshold currents and also sudden fails of the device caused by overtemperatures.

The process may allow analysis, portion by portion, of the integrated circuit, and deactivation in a single and selective way of only one junction of a group if it is subjected to a critical thermal event. This may help simultaneously ensure the maximum possible efficiency of the power device.

Figure 15:
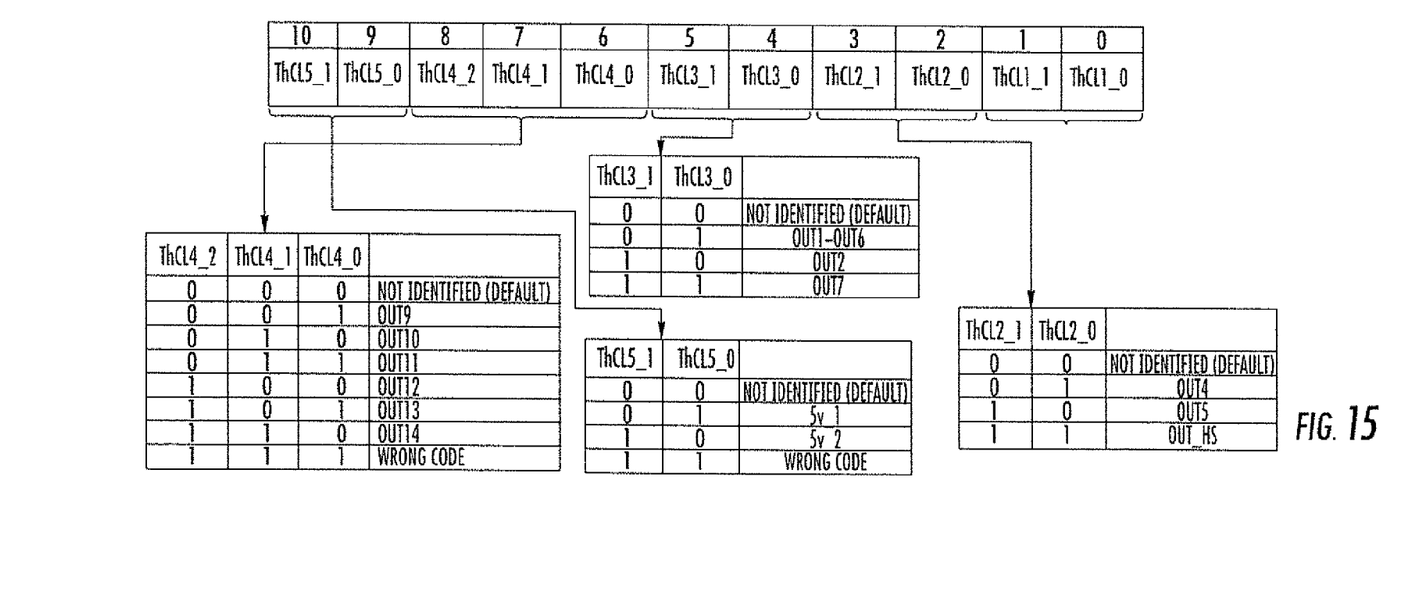

In accordance with an example implementation, an electric power device as described above may be implemented by appropriate hardware and/or software implemented in a non-transitory computer-readable medium having computer-executable instructions for performing the various operations set forth herein. For example, as schematically illustrated in FIG. 13, microcontrollers SPC560D and L99DZ100(P) may be used, along with a communication protocol SPI. One example application for such a configuration is for a control process for a power device for use in the automotive field. More specifically, a "door zone" device enables control of mirrors, windows and locking systems, on-door lights, etc., of a motor vehicle for providing enhanced comfort for the passengers. FIGS. 14 and 15 provide an example implementation of how detected data may be stored in the first and/or second state registers of the above-described storage devices.

The invention claimed is:

1. A thermal control method for an electronic device comprising an integrated circuit having a plurality of junction groups, with each junction group comprising a plurality of junctions, and each junction group having a respective thermal detector associated therewith to detect a respective group temperature associated with the respective junction group, the method comprising:

comparing the detected group temperatures with a critical thermal group threshold to identify a critical thermal group from among the plurality of junction groups, wherein the junction group having a group temperature exceeding the critical thermal group threshold is identified as the critical thermal group;

deactivating all junctions of the critical thermal group while maintaining the remaining junction groups active;

subsequent to deactivating all junctions of the critical thermal group in response to the group temperature exceeding the critical thermal group threshold, activating one given junction from among the plurality of junctions of the critical thermal group as an active junction while keeping deactivated all other junctions from among the plurality of junctions of the critical thermal group;

detecting the group temperature of the critical thermal group having the active junction and the all other deactivated junctions;

comparing the detected group temperature of the critical thermal group having the active junction and the all other deactivated junctions to a junction thermal critical threshold; and deactivating the active junction in response to the detected group temperature exceeding the junction thermal critical threshold while activating all other junctions of the critical thermal group.

2. The method of claim 1, further comprising:
deactivating the active junction in response to the detected group temperature being below the junction thermal critical threshold;
activating one junction from along the other junctions as a new active junction while keeping deactivated all other junctions from among the plurality of junctions of the critical thermal group;
detecting the group temperature of the critical thermal group having the new active junction and the all other deactivated junctions;
comparing the detected group temperature of the critical thermal group having the new active junction and the all other deactivated junctions to the junction thermal critical threshold; and
deactivating the new active junction in response to the detected group temperature exceeding the junction thermal critical threshold while activating all other junctions of the critical thermal group.

3. The method of claim 1 wherein the detectors generate group electric signals representing respective detected group temperatures; and
wherein the method further comprises digitizing the group electric signals for comparison with the critical thermal group threshold.

4. The method of claim 1 wherein the comparing comprises sequentially comparing the detected group temperatures for each junction group with the critical thermal group threshold.

5. The method of claim 1 wherein the junctions are arranged in the junction groups according to their spatial arrangement within the integrated circuit.

6. The method of claim 1 wherein the junctions are arranged in the junction groups according to their operation.

7. An electronic device comprising:
integrated circuitry having a plurality of junction groups, wherein each junction group comprises a plurality of junctions;
a plurality of thermal detectors, each thermal detector associated with a respective junction group; and
a controller configured to:
compare the detected group temperatures with a critical thermal group threshold to identify a critical thermal group from among the plurality of junction groups, wherein the junction group having a group temperature exceeding the critical thermal group threshold is identified as the critical thermal group;
deactivate all junctions of the critical thermal group while maintaining the remaining junction groups active;
subsequent to deactivating all junctions of the critical thermal group in response to the group temperature exceeding the critical thermal group threshold, activate one given junction from among the plurality of junctions of the critical thermal group as an active junction while keeping deactivated all other junctions from among the plurality of junctions of the critical thermal group;
detect the group temperature of the critical thermal group having the active junction and the all other deactivated junctions;

compare the detected group temperature of the critical thermal group having the active junction and the all other deactivated junctions to a junction thermal critical threshold; and
deactivate the active junction in response to the detected group temperature exceeding the junction thermal critical threshold while activating all other junctions of the critical thermal group.

8. The electronic device of claim 7, wherein the controller is further configured to:
deactivate the active junction in response to the detected group temperature being below the junction thermal critical threshold;
activate one junction from along the other junctions as a new active junction while keeping deactivated all other junctions from among the plurality of junctions of the critical thermal group;
detect the group temperature of the critical thermal group having the new active junction and the all other deactivated junctions;
compare the detected group temperature of the critical thermal group having the new active junction and the all other deactivated junctions to the junction thermal critical threshold; and
deactivate the new active junction in response to the detected group temperature exceeding the junction thermal critical threshold while activating all other junctions of the critical thermal group.

9. The electronic device of claim 7 wherein the thermal detectors generate group electric signals representing respective detected group temperatures; and further comprising an analog-to-digital (A/D) converter coupled between the thermal detectors and the controller and configured to digitize the group electric signals.

10. The electronic device of claim 9 wherein the A/D comprises a 10-bit A/D converter.

11. The electronic device of claim 7 wherein the controller sequentially compares the detected group temperatures for each junction group with the critical thermal group threshold.

12. The electronic device of claim 7 wherein the junctions are arranged in the junction groups according to their spatial arrangement within the integrated circuit.

13. The electronic device of claim 7 wherein the junctions are arranged in the junction groups according to their operation.

14. A non-transitory computer-readable medium for use with an integrated circuit having a plurality of junction groups, with each junction group comprising a plurality of junctions, and each junction group having a respective thermal detector associated therewith to detect a respective group temperature associated with the respective junction group, the non-transitory computer-readable medium having computer executable instructions for causing a controller to perform steps comprising:
comparing the detected group temperatures with a critical thermal group threshold to identify a critical thermal group from among the plurality of junction groups, wherein the junction group having a group temperature exceeding the critical thermal group threshold is identified as the critical thermal group;
deactivating all junctions of the critical thermal group while maintaining the remaining junction groups active;
subsequent to deactivating all junctions of the critical thermal group in response to the group temperature exceeding the critical thermal group threshold, activating one given junction from among the plurality of junctions of the critical thermal group as an active junction while keeping deactivated all other junctions from among the plurality of junctions of the critical thermal group;

detecting the group temperature of the critical thermal group having the active junction and the all other deactivated junctions;

comparing the detected group temperature of the critical thermal group having the active junction and the all other deactivated junctions to a junction thermal critical threshold; and deactivating the active junction in response to the detected group temperature exceeding the junction thermal critical threshold while activating all other junctions of the critical thermal group.

15. The non-transitory computer-readable medium of claim 14, wherein the computer executable instructions further cause the controller to perform the steps of:

deactivating the active junction in response to the detected group temperature being below the junction thermal critical threshold;

activating one junction from along the other junctions as a new active junction while keeping deactivated all other junctions from among the plurality of junctions of the critical thermal group;

detecting the group temperature of the critical thermal group having the new active junction and the all other deactivated junctions;

comparing the detected group temperature of the critical thermal group having the new active junction and the all other deactivated junctions to the junction thermal critical threshold; and deactivating the new active junction in response to the detected group temperature exceeding the junction thermal critical threshold while activating all other junctions of the critical thermal group.

16. The non-transitory computer-readable medium of claim 14 wherein comparing comprises sequentially comparing the detected group temperatures for each junction group with the critical thermal group threshold.

17. The non-transitory computer-readable medium of claim 14 further having computer-executable instructions for receiving group electric from the detectors representing respective detected group temperatures; and digitizing the group electric signals for comparison with the critical thermal group threshold.

\* \* \* \* \*

UNITED STATES PATENT AND TRADEMARK OFFICE
CERTIFICATE OF CORRECTION

PATENT NO.       : 9,992,916 B2
APPLICATION NO.  : 14/595391
DATED            : June 5, 2018
INVENTOR(S)      : Torrisi et al.

Page 1 of 1

It is certified that error appears in the above-identified patent and that said Letters Patent is hereby corrected as shown below:

On the Title Page

Item (73) Assignees, Line 5, delete "Ascheim-Dornbach (DE)" and insert --Ascheim-Dornach (DE)--.

Signed and Sealed this
Fourteenth Day of August, 2018

Andrei Iancu
*Director of the United States Patent and Trademark Office*